(12) United States Patent
Takai

(10) Patent No.: US 9,431,094 B1
(45) Date of Patent: Aug. 30, 2016

(54) INPUT BUFFER

(71) Applicant: Micron Technology, Inc., Boise, ID (US)

(72) Inventor: Yasuhiro Takai, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/987,355

(22) Filed: Jan. 4, 2016

(51) Int. Cl.
*G11C 16/04* (2006.01)
*G11C 11/4093* (2006.01)
*G11C 11/4076* (2006.01)

(52) U.S. Cl.
CPC ........ *G11C 11/4093* (2013.01); *G11C 11/4076* (2013.01)

(58) Field of Classification Search
CPC ....................................... G11C 16/04
See application file for complete search history.

(56) References Cited

U.S. PATENT DOCUMENTS

| 6,943,617 B2 * | 9/2005 | Tran ........................ G05F 3/30 327/539 |
| 8,773,168 B2 * | 7/2014 | Huang ..................... G01R 19/04 327/408 |
| 8,885,386 B2 | 11/2014 | Youn et al. |
| 9,083,287 B2 * | 7/2015 | Papamichail ............. H03F 3/16 |
| 2005/0140428 A1 * | 6/2005 | Tran ......................... G05F 3/30 327/539 |
| 2009/0160496 A1 * | 6/2009 | Takeuchi ....... H03K 19/018564 327/108 |
| 2013/0293109 A1 * | 11/2013 | Cheon ................ H05B 33/0887 315/122 |
| 2014/0002139 A1 * | 1/2014 | Huang ................... G01R 19/04 327/58 |

FOREIGN PATENT DOCUMENTS

JP 2002-217654 A 8/2002

* cited by examiner

*Primary Examiner* — Harry W Byrne
(74) *Attorney, Agent, or Firm* — Dorsey & Whitney LLP

(57) ABSTRACT

Apparatuses including a data input circuit of a semiconductor device are described. An example apparatus includes a first transistor that receives a reference voltage, a second transistor that receives an input signal, cross-couple type transistors, diode-connect type transistors and resistors. The cross-couple type resistors include a third transistor having a gate coupled to a drain of the second transistor, and a fourth transistor having a gate coupled to a drain of the first transistor. The diode-connect type transistors include a fifth transistor having a drain coupled to a drain of the third transistor, and a sixth transistor having a drain coupled to a drain of the fourth transistor. The resistors include a first resistor coupled between a gate and the drain of the fifth transistor and a second resistor coupled between a gate and the drain of the sixth transistor.

20 Claims, 7 Drawing Sheets

_US 9,431,094 B1_

INPUT BUFFER

BACKGROUND

High data reliability, high speed of memory access, and reduced chip size are features that are demanded from semiconductor memory. In recent years, there has been an effort to further increase the speed of memory access.

For example, an input buffer may include resister loads coupled to positive power supply nodes and a pair of field-effect transistors having a low threshold voltage for receiving an input signal. The on-die termination provided by the resistor loads may be used for impedance matching with data lines. According to a simulation test of the input buffer, the input buffer shows ability to increase a data rate to 4.5 Gbps. Thus, the input buffer is likely to be suitable in a double data rate fourth generation synchronous dynamic random-access memory (DDR4-SDRAM) with a data rate of 3.2 Gbps.

The input buffer is also evaluated by applying a rank margining test. In a rank margining test, a reference voltage (VREF) level may be varied from a mid-point between a voltage of input high (VIH) and a voltage of input low (VIL) to test a margin of RMT as performance tolerance. The input buffer is required to operate without any errors even if the reference voltage shifts, as long as the reference voltage is in a predetermined range.

However, with the approach described above, when the VREF is shifted to a higher voltage, the time an input signal is greater than the VREF becomes shorter. The voltage level of a high pulse of the input signal becomes lower when a width of the high pulse becomes shorter. As a result, a slew rate of the input signal may deteriorate. These results suggest that the input buffer merely including the resister loads coupled to the positive power supply nodes, and the pair of field-effect transistors having the low threshold voltage may not be acceptable in the DDR4-SDRAM. Thus, an input buffer which has a high data rate sufficient for a data rate of DDR4-SDRAM and performance tolerance against a shift of a reference voltage may be desired.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
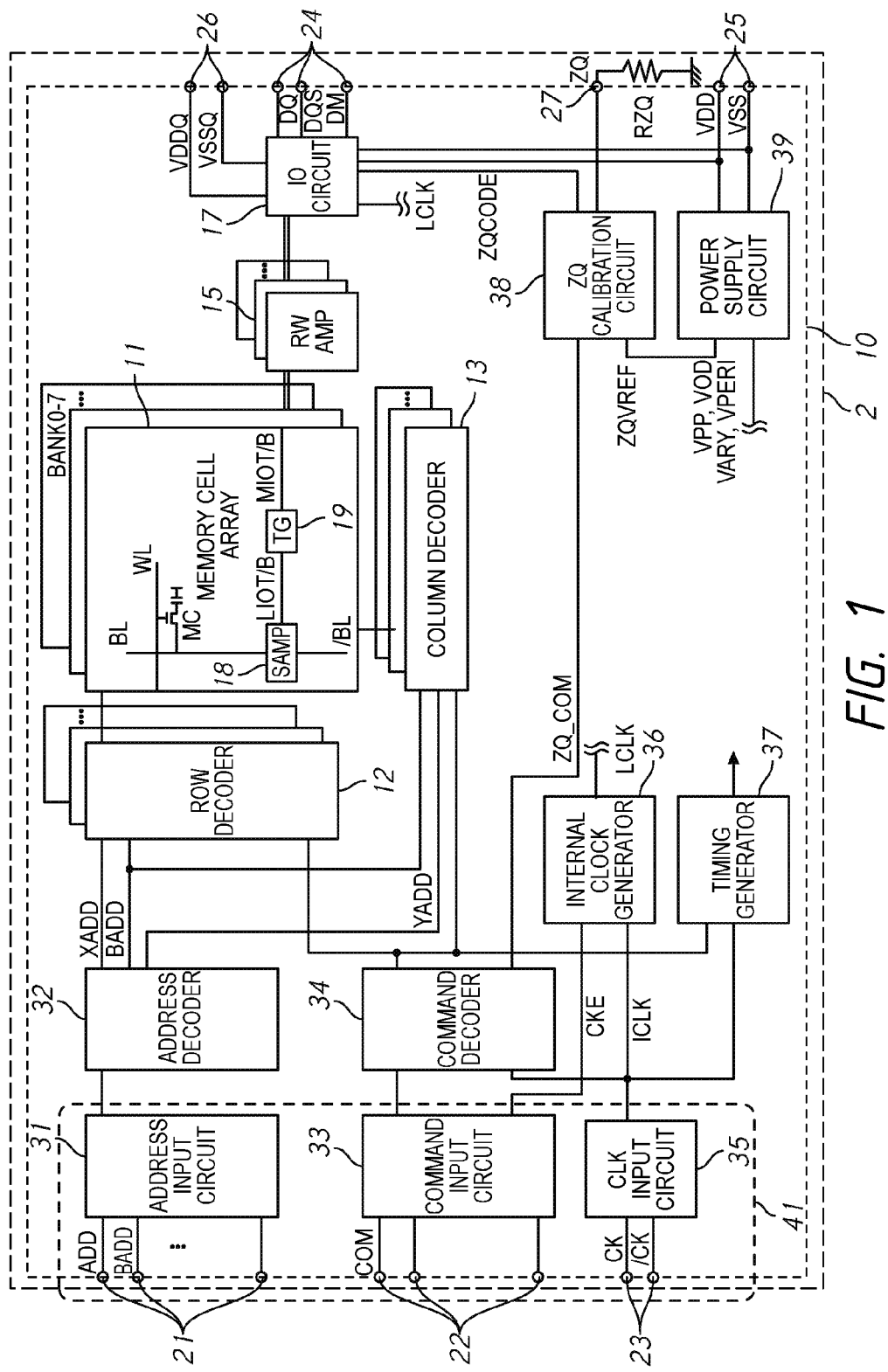
FIG. 1 is a block diagram of a semiconductor device in accordance with an embodiment of the present disclosure.

FIG. 1 is a block diagram of a semiconductor device in accordance with an embodiment of the present disclosure. The semiconductor device 10 may be a DDR4 SDRAM integrated into a single semiconductor chip, for example. The semiconductor device 10 may be mounted on an external substrate 2 that is a memory module substrate, a mother board or the like. The external substrate 2 employs an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23. A data interface block 42 includes the data terminals 24. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQC provided to the ZQ calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input/output circuit 17 may include input buffers, according to one embodiment.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

Figure 2:
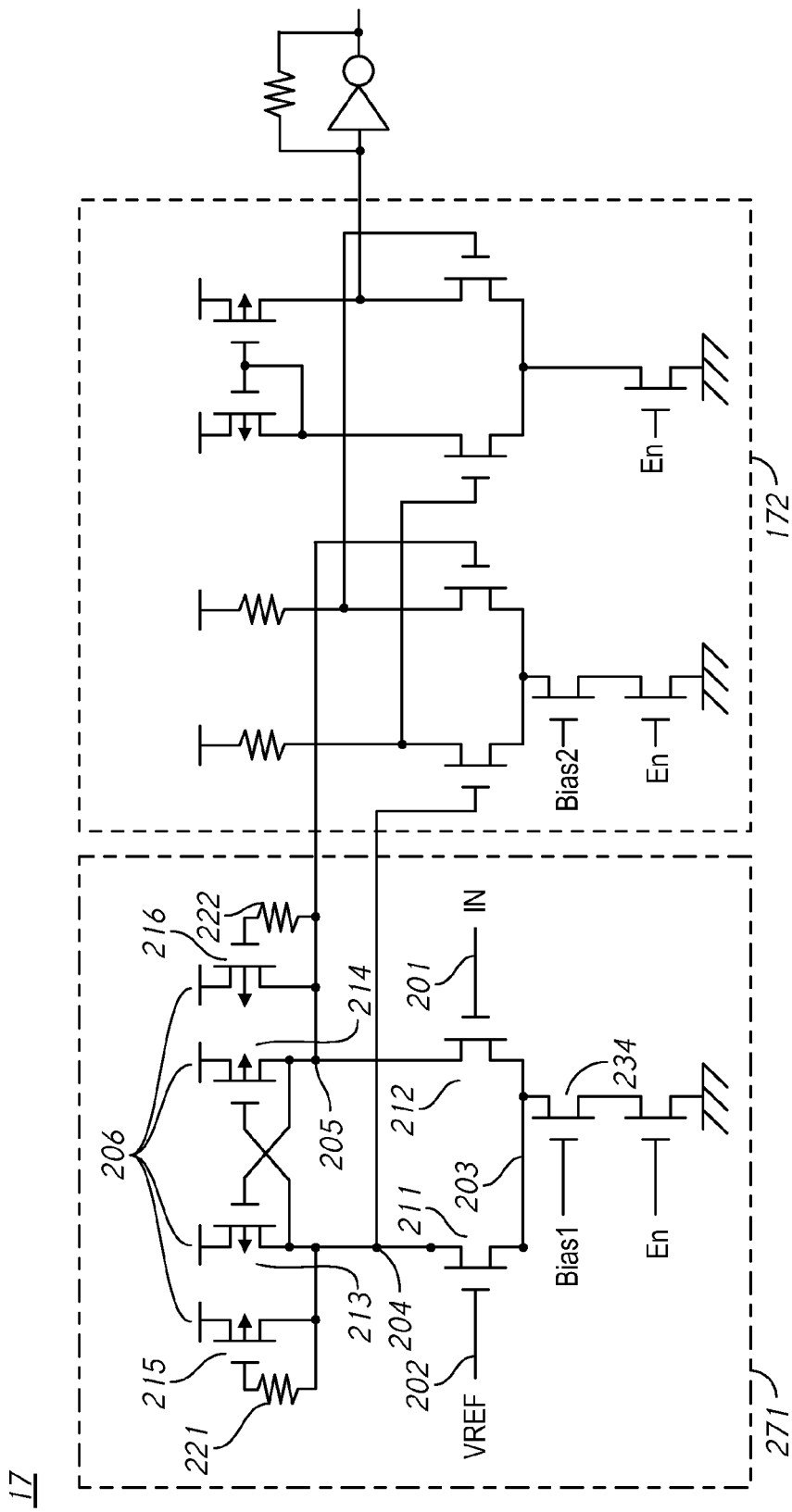
FIG. 2 is a circuit diagram of an apparatus including an input buffer according to an embodiment of the present disclosure.

FIG. 2 is a circuit diagram of an apparatus including an input buffer according to an embodiment of the present disclosure. The apparatus may be, for example, an input/output circuit that includes the input buffer. The input buffer may be included in the input/output circuit 17 of FIG. 1 in some embodiments. As will be described in more detail below, the input/output circuit 17 in FIG. 2 may include a combination of a data input circuit 271 and at least one amplifier 172 that functions as an input buffer. The data input circuit 271 includes an input node 201 that receives an input signal (IN), such as one of the write data DQ that is supplied to the data terminals 24 in FIG. 1, and a reference node 202 supplied with a reference voltage (VREF). The data input circuit 271 also includes a first node 203, a second node 204, a third node 205 and a fourth node 206. For example, the fourth node 206 in FIG. 2 may be a power supply node that is supplied with the power supply potential VDD from the power supply terminals 25 in FIG. 1. The data input circuit 271 also includes a first transistor 211 coupled between the first node 203 and the second node 204 that is a first output node. The first transistor 211 has a gate coupled to the reference node 202 that receives the reference voltage (VREF). The data input circuit 271 also includes a second transistor 212 coupled between the first node 203 and the third node 205 that is a second output node. The second transistor 212 has a gate coupled to the input node 201 that receives the input signal (IN). The data input circuit 271 also includes a third transistor 213 coupled between the second node 204 and the fourth node 206. The third transistor 213 may have a gate coupled to the third node 205 that is further coupled to a drain of the second transistor 212. The data input circuit 271 further includes a fourth transistor 214 coupled between the third node 205 and the fourth node 206. The fourth transistor 214 may have a gate coupled to the second node 204 that is further coupled to a drain of the first transistor 211. The data input circuit 271 also includes a first resistor 221 and a second resistor 222. The first resistor 221 has one end coupled to the second node 204 and the other end. The second resistor 222 has at least two ends including one end coupled to the third node 205 and the other end. The data input circuit 271 also includes a fifth transistor 215 and a sixth transistor 216. The fifth transistor 215 is coupled between the second node 204 and the fourth node 206, and has a gate coupled to the other end of the first resistor 221. The sixth transistor 216 is coupled between the third node 205 and the fourth node 206, and has a gate coupled to the other end of the second resistor 222. The data input circuit 271 may also include a bias transistor 234 coupled between the first node 203 and a ground node via an enable transistor, which receives an enable signal En. The bias transistor 234 has a gate that receives a first bias signal (Bias1). The ground node is supplied with the power supply potential VSS from the power supply terminals 25 in FIG. 1.

A combination of the third transistor 213 and the fourth transistor 214 may be grouped as a pair of "cross-couple type" transistors where a gate of one transistor is coupled to a drain of the other transistor. A combination of the fifth transistor 215 and the sixth transistor 216 together with the first resistor 221 and the second resistor 222 may be grouped as a pair of "diode-connect type" transistors, each of which has its gate and its drain coupled to each other. In this embodiment, a first impedance between the second node 204 and the fourth node 206 and a second impedance between the third node 205 and the fourth node 206 are substantially the same. The first resistor 221 and the second resistor 222 may have substantially the same resistance.

In an example operation, when the input signal at the input node 201 is a logic-high (e.g., a relatively high voltage closer to power supply voltage), a signal level at the third node 205 becomes a logic-low (e.g., a relatively low voltage closer to ground) which is received at the gate of the third transistor 213. This logic-low at the third node 205 increases a potential of the second node 204, which is the first output node of the data input circuit 271, responsive to the logic-high input signal. When the potential of the second node 204 is increased, a potential at the gate of the fifth transistor 215 is also increased. The first resistor 221 causes a delay in transmitting the potential of the second node 204 to the gate of the fifth transistor 215. Thus, during the delay, both the gate of the third transistor 213 and the gate of the fifth transistor 215 may receive a signal with a potential of a logic-low which causes a steep transient shift in potential of the second node 204 to a logic-high potential. Similarly, the second resistor 222 accelerates a potential transition of the third node 205 that is the second output node.

In FIG. 2, for example, the amplifier 172 is coupled to the second node 204 and the third node 205 of the data input circuit 271. For example, the amplifier 172 may include a first differential amplifier with resistor loads and a second differential amplifier with transistor loads. The first differential amplifier may be biased by a second bias signal. The amplifier 172 provides a signal having a level that is determined responsive to a potential difference between the second node 204 and the third node 205. For example, the amplifier 172 may include a differential amplifier circuit as depicted in FIG. 2. However, in other embodiments, data amplifier circuit(s) other than those specifically described in the present disclosure may be used without departing from the scope of the present disclosure.

Figure 3:
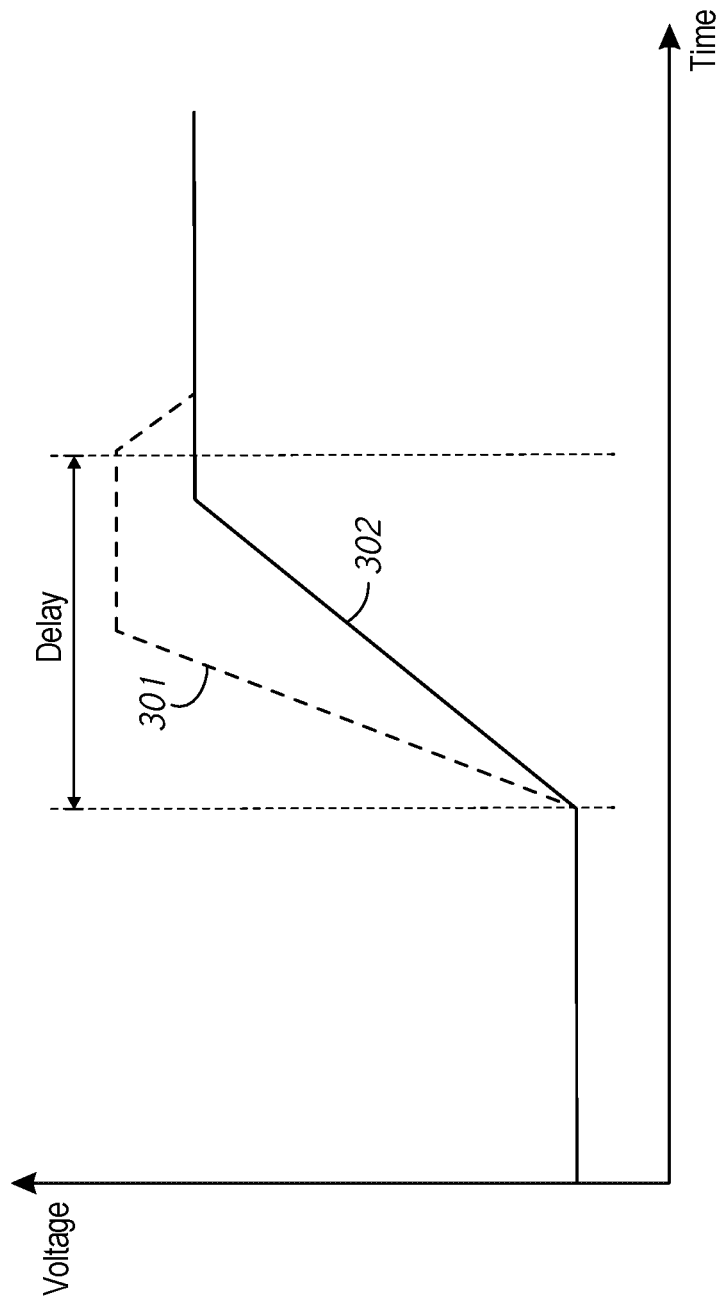
FIG. 3 is a diagram of potential transitions of a first output node of a data input circuit according to an embodiment of the present disclosure.

FIG. 3 is a diagram of potential transitions of the first output node of the data input circuit according to one embodiment of the present disclosure. In particular, the first output node is the second node 204, when the input node 201 receives the input signal is logic-high. A horizontal axis represents time and a vertical axis represents voltage, which is the potential of the second node 204. A dashed line 301 represents a transition of a potential transition of the second node 204 with the first resistor 221 and a solid line 302 represents a transition of a potential transition of the second node 204 without the first resistor 221. Due to the delay in transmitting the potential of the second node 204 to the gate of the fifth transistor 215 caused by the first resistor 221, the fifth transistor 215 remains active in a manner to accelerate a potential transition of the second node 204. As shown in FIG. 3, a gradient of the dashed line 301 is steeper than a gradient of the solid line 302 during the delay. Thus, diode-connected transistors, such as the fifth transistor 215 and the sixth transistor 216, are slowly activated/inactivated due to acceleration of potential transition of the second node 204 and the third node 205 by the resistors 221 and 222, respectively. Simultaneously, cross-coupled transistors such as the third transistor 213 and the fourth transistor 214 are strongly activated/inactivated compared to the transistors 215 and 216. The combination of slow activation/inactivation of the transistors 215 and 216, and fast activation/inactivation of the cross-coupled transistors 213 and 214 causes a voltage level of the first output node such as the second node 204 of the data input circuit 271 to rapidly change when a voltage level of the input signal at the input node 201 changes.

Figure 4:
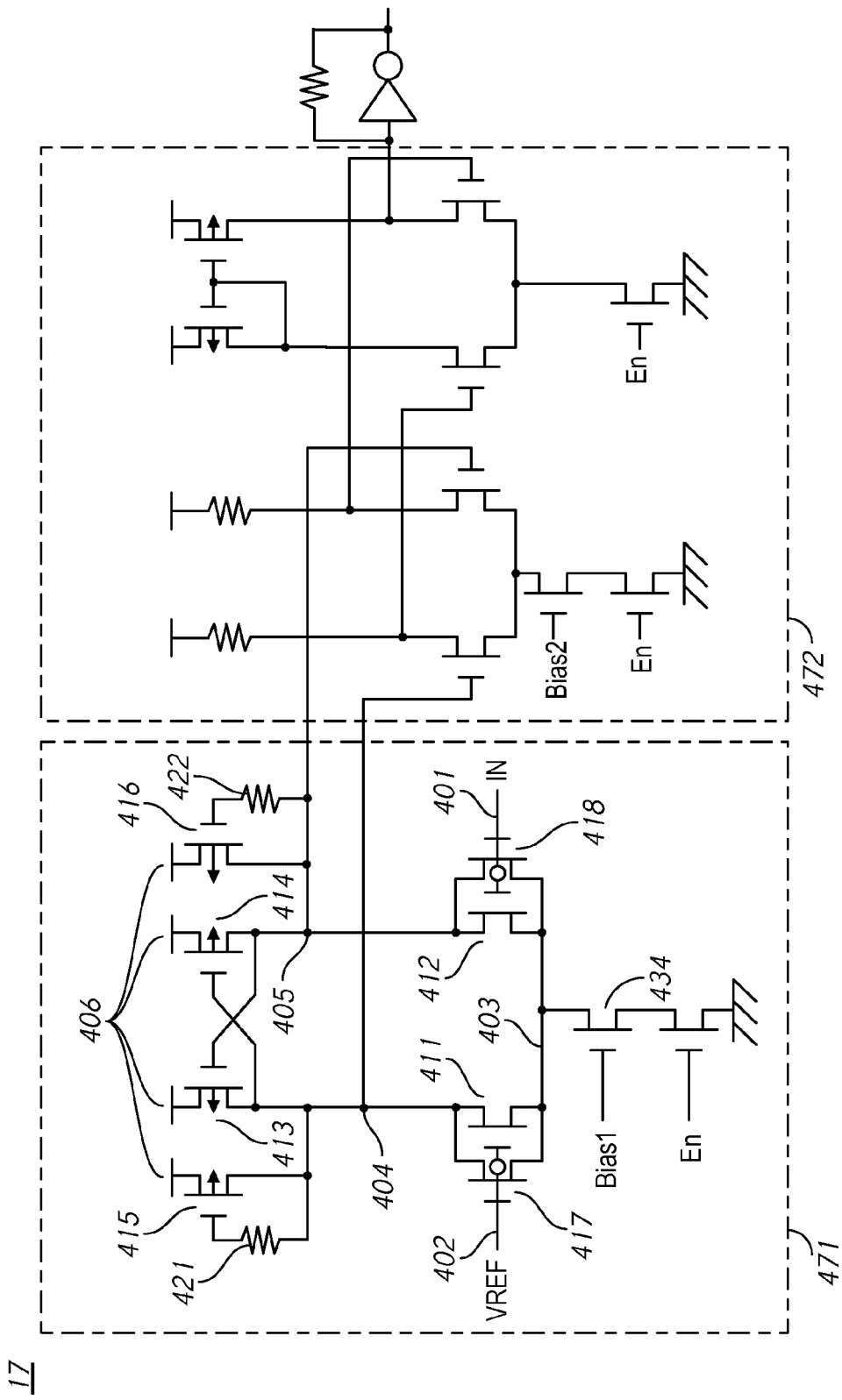
FIG. 4 is a circuit diagram of an apparatus including an input buffer according to an embodiment of the present disclosure.

FIG. 4 is a circuit diagram of an apparatus including an input buffer according to an embodiment of the present disclosure. The apparatus is an input/output circuit that may be applied to the input/output circuit 17 of FIG. 1. As will be described in more detail below, the input/output circuit 17 in FIG. 4 may include a combination of a data input circuit 471 and at least one amplifier 472 that functions as an input buffer. The data input circuit 471 includes an input node 401 that receives an input signal (IN), such as one of the write data DQ that is supplied to the data terminals 24 in FIG. 1, and a reference node 402 supplied with a reference voltage (VREF). The data input circuit 471 also includes a first node 403, a second node 404, a third node 405 and a fourth node 406. For example, the fourth node 406 in FIG. 2 may be a power supply node that is supplied with the power supply potential VSS from the power supply terminals 25 in FIG. 1. The data input circuit 471 also includes a first transistor 411 coupled between the first node 403 and the second node 404 and further having a gate coupled to the reference node 402 that receives the reference voltage (VREF). The data input circuit 471 also includes a second transistor 412 coupled between the first node 403 and the third node 405 and further having a gate coupled to the input node 401 that receives the input signal (IN). The data input circuit 471 also includes a third transistor 413 coupled between the second node 404 and the fourth node 406. The data input circuit 471 further includes a fourth transistor 414 coupled between the third node 405 and the fourth node 406. The data input circuit 471 also includes a first resistor 421 and a second resistor 422. The first resistor 421 has one end coupled to the second node 404 and an other end. The second resistor 422 has at least two ends including one end coupled to the third node 405 and an other end. The data input circuit 471 also includes a fifth transistor 415 and a sixth transistor 416. The fifth transistor 415 is coupled between the second node 404 and the fourth node 406, and has a gate coupled to the other end of the first resistor 421. The sixth transistor 416 is coupled between the third node 405 and the fourth node 406, and has a gate coupled to the other end of the second resistor 422. The data input circuit 471 may also include a bias transistor 434 coupled between the first node 403 and a ground node via an enable transistor, which receives an enable signal En. The bias transistor 434 has a gate that receives a first bias signal (Bias1). The ground node is supplied with the power supply potential VSS from the power supply terminals 25 in FIG. 1.

The data input circuit 471 may further include a seventh transistor 417 coupled between the first node 403 and the second node 404 and has a gate coupled to the reference node 402. The data input circuit 471 may also further include an eighth transistor 418 coupled between the first node 403 and the third node 405 and has a gate coupled to the input node 401. The seventh transistor 417 is different from the parallel-coupled first transistor 411 in a threshold voltage. Similarly, the eighth transistor 418 is different from the parallel-coupled second transistor 412 in the threshold voltage. For example, the first transistor 411 and the second transistor 412 may have a first threshold voltage (normal Vt) and the seventh transistor 417 and the eight transistor 418 may have a second threshold voltage (low Vt) lower than the first threshold voltage. When an input signal based on a lower power supply voltage is applied at the input node 401, a transistor which can be active with a lower voltage level at a gate, such as the eighth transistor 418, becomes primarily active while the second transistor 412 may not be active. On the other hand, when the input signal based on a higher power supply voltage is applied at the input node 401, the eighth transistor 418 may operate in a triode region because of a large difference between a voltage between a gate and a source (Vgs) and the second threshold voltage due to the higher power supply voltage at the gate. However, the second transistor 412 which has the first threshold higher than the second threshold voltage still primarily operates in a saturation region. Thus, the pair parallel-coupled transistors, the second transistor 412 and the eighth transistor 418 is able to operate with the input signal of either the lower power supply voltage or the higher power supply voltage. Similarly, the first transistor 411 and the seventh transistor 417 are able to operate with a reference voltage (VREF) at the reference node 402 of either the lower voltage range or the higher voltage range. Thus, the combination of a transistor with a low threshold voltage and a transistor with a high threshold voltage is able to operate for a signal having a wide voltage range. For example, the data input circuit 471 described above is also evaluated by applying a rank margining test provided by a Rank Margining Tool® of Intel™. A delay time difference of propagation delays (dtPD) between a falling propagation delay (tPDF) and a rising propagation delay (tPDR) which may be decreased to half by applying a pair of transistors having different threshold voltages. The smaller dtPD gives a large margin that enables the data input circuit 471 to operate in a higher data rate. A data input circuit without a pair of transistors for different threshold voltages may perform poorly due to a transistor for receiving a signal that may have a low threshold voltage and may function in the triode section. With a pair of transistors for different threshold voltages, the data input circuit may operate with a wide range of voltages.

In the data input circuit 471, each of the first transistor 411, the second transistor 412, the seventh transistor 417 and the eighth transistor 418 is of a first conductivity type, and each of the third transistor 413, the fourth transistor 414, the fifth transistor 415 and the sixth transistor 416 is of a second conductivity type. For example, the first conductivity type may be a P-channel field effect type, and the second conductivity type may be an N-channel field effect type.

Figure 5:
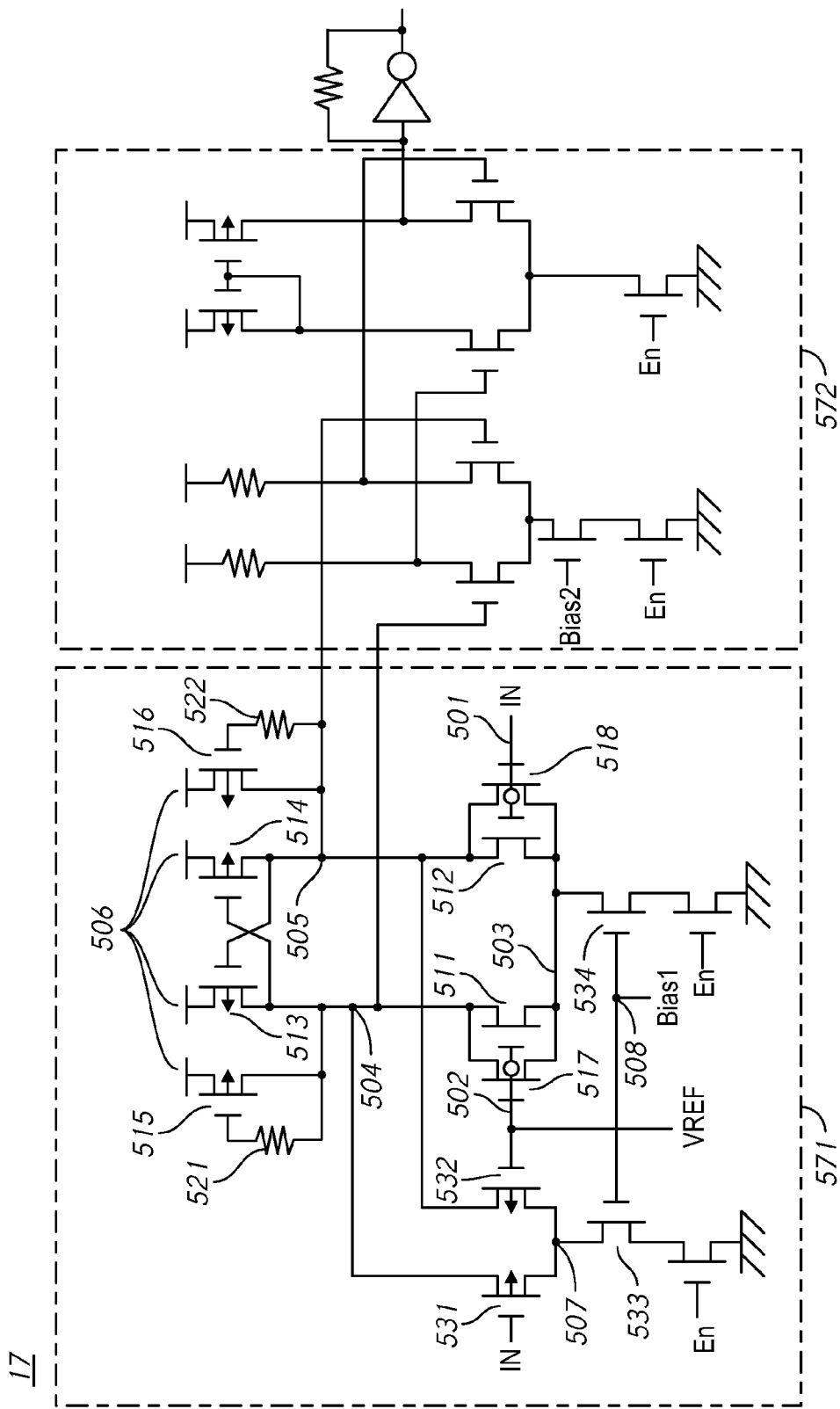
FIG. 5 is a circuit diagram of an apparatus including an input buffer according to an embodiment of the present disclosure.

FIG. 5 is a circuit diagram of an apparatus including an input buffer according to an embodiment of the present disclosure. The apparatus may be an input/output circuit that may be applied to the input/output circuit 17 of FIG. 1. As will be described in more detail below, the input/output circuit 17 in FIG. 5 may include a combination of a data input circuit 571 and at least one amplifier 572 that functions as an input buffer. The data input circuit 571 includes an input node 501 that receives an input signal (IN), such as one of the write data DQ that is supplied to the data terminals 24 in FIG. 1, and a reference node 502 supplied with a reference voltage (VREF). The data input circuit 571 also includes a first node 503, a second node 504, a third node 505 and a fourth node 506. For example, the fourth node 506 in FIG. 2 may be a power supply node that is supplied with the power supply potential VDD from the power supply terminals 25 in FIG. 1. The data input circuit 571 also includes a first transistor 511 coupled between the first node 503 and the second node 504 and further having a gate coupled to the reference node 502 that receives the reference voltage (VREF). The data input circuit 571 also includes a second transistor 512 coupled between the first node 503 and the third node 505 and further having a gate coupled to the input node 501 that receives the input signal (IN). The data input circuit 571 also includes a third transistor 513 coupled between the second node 504 and the fourth node 506. The data input circuit 571 further includes a fourth transistor 514 coupled between the third node 505 and the fourth node 506. The data input circuit 571 also includes a first resistor 521 and a second resistor 522. The first resistor 521 has one end coupled to the second node 504 and an other end. The second resistor 522 has one end coupled to the third node 505 and the other end. The data input circuit 571 also includes a fifth transistor 515 and a sixth transistor 516. The fifth transistor 515 is coupled between the second node 504 and the fourth node 506, and has a gate coupled to the other end of the first resistor 521. The sixth transistor 516 is coupled between the third node 505 and the fourth node 506, and has a gate coupled to the other end of the second resistor 522. A ground node is supplied with the power supply potential VSS from the power supply terminals 25 in FIG. 1. The data input circuit 571 may further include a ninth transistor 531 coupled between the second node 504 and a fifth node 507 and has a gate coupled to the input node 501. The data input circuit 571 may also further include a tenth transistor 532 coupled between the third node 505 and the fifth node 507 and has a gate coupled to the reference node 502. A combination of the ninth transistor 531 and the tenth transistor 532 may further provide operation with a wider power supply voltage range and with a wider reference voltage range compared to the power supply voltage range and the reference voltage range provided by the parallel-connect type transistors in the FIG. 4. The data input circuit 571 may further include a first bias transistor 533 and a second bias transistor 534. The first bias transistor 533 may be coupled between the fifth node 507 and the ground node through a first enable transistor, and the second bias transistor 534 may be coupled between the first node 503 and the ground node through a second enable transistor. The first and second enable transistors are provided with an enable signal En to control operation of the data input circuit 571. A sixth node 508 coupled to a gate of the first bias transistor 533 and a gate of the second bias transistor 534 is provided with a bias signal (Bias1) that is provided to the first bias transistor 533 and the second bias transistor 534. The bias signal is provided to control the bias of the data input circuit 571.

Figure 6:
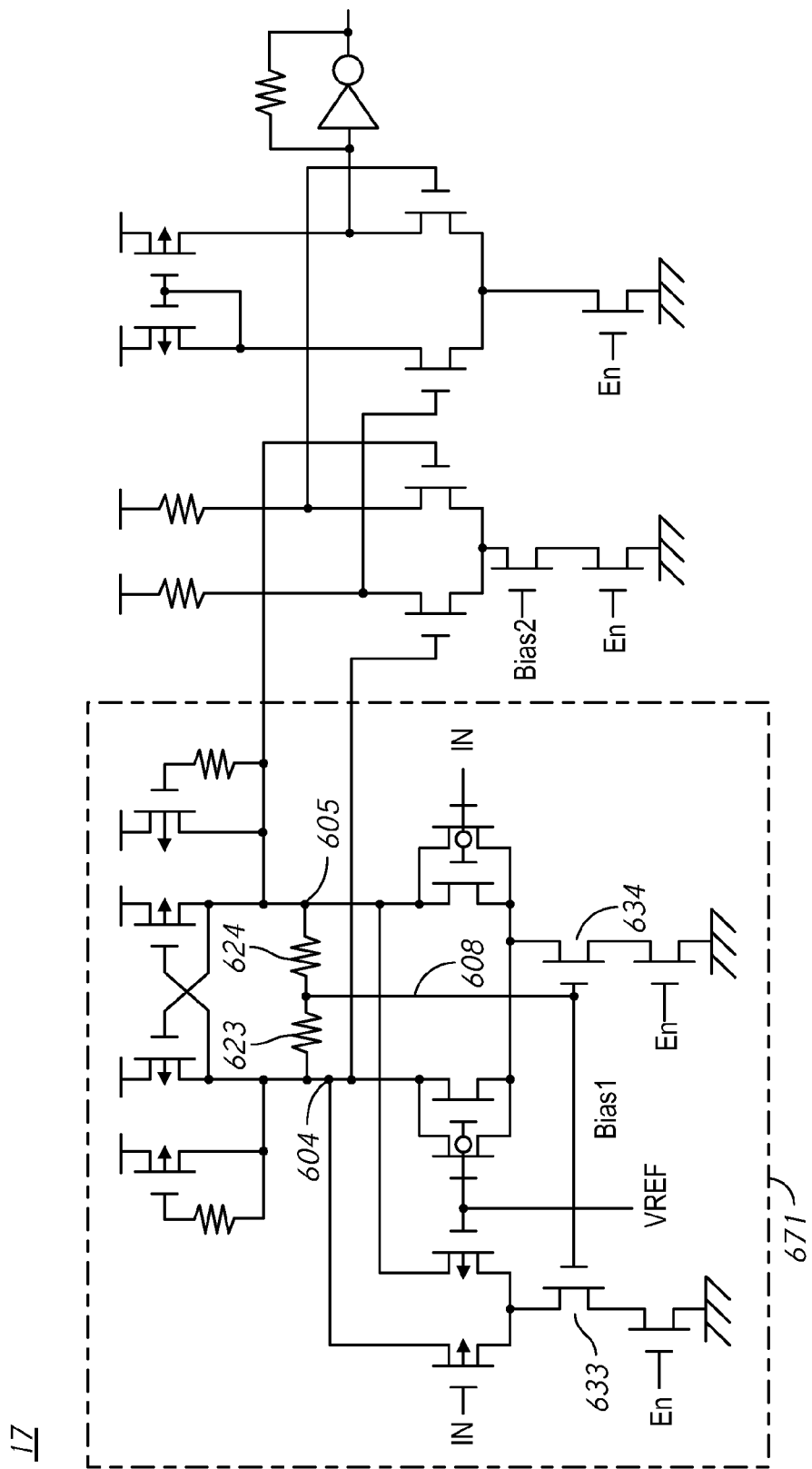
FIG. 6 is a circuit diagram of an apparatus including an input buffer according to an embodiment of the present disclosure.

FIG. 6 is a circuit diagram of an apparatus including an input buffer according to an embodiment of the present disclosure. The apparatus is an input/output circuit that may be applied to the input/output circuit 17 of FIG. 1. Description of components corresponding to components included in FIG. 5 will not be repeated. The data input circuit 671 may further include a third resistor 623, a fourth resistor 624. One end of the third resistor 623 is coupled to a second node 604. The fourth resistor 624 has one end coupled to the other end of the third resistor 623 and the other end coupled to the third node 605. The other end of the third resistor 623 and the one end of the fourth resistor 624 are coupled to the sixth node 608. Furthermore, a gate of a first bias transistor 633 and a gate of a second bias transistor 634 are also coupled to the sixth node 608. Thus, the sixth node 608 provides a self-bias signal to the data input circuit 671 via the first bias transistor 633 and the second bias transistor 634.

Figure 7:
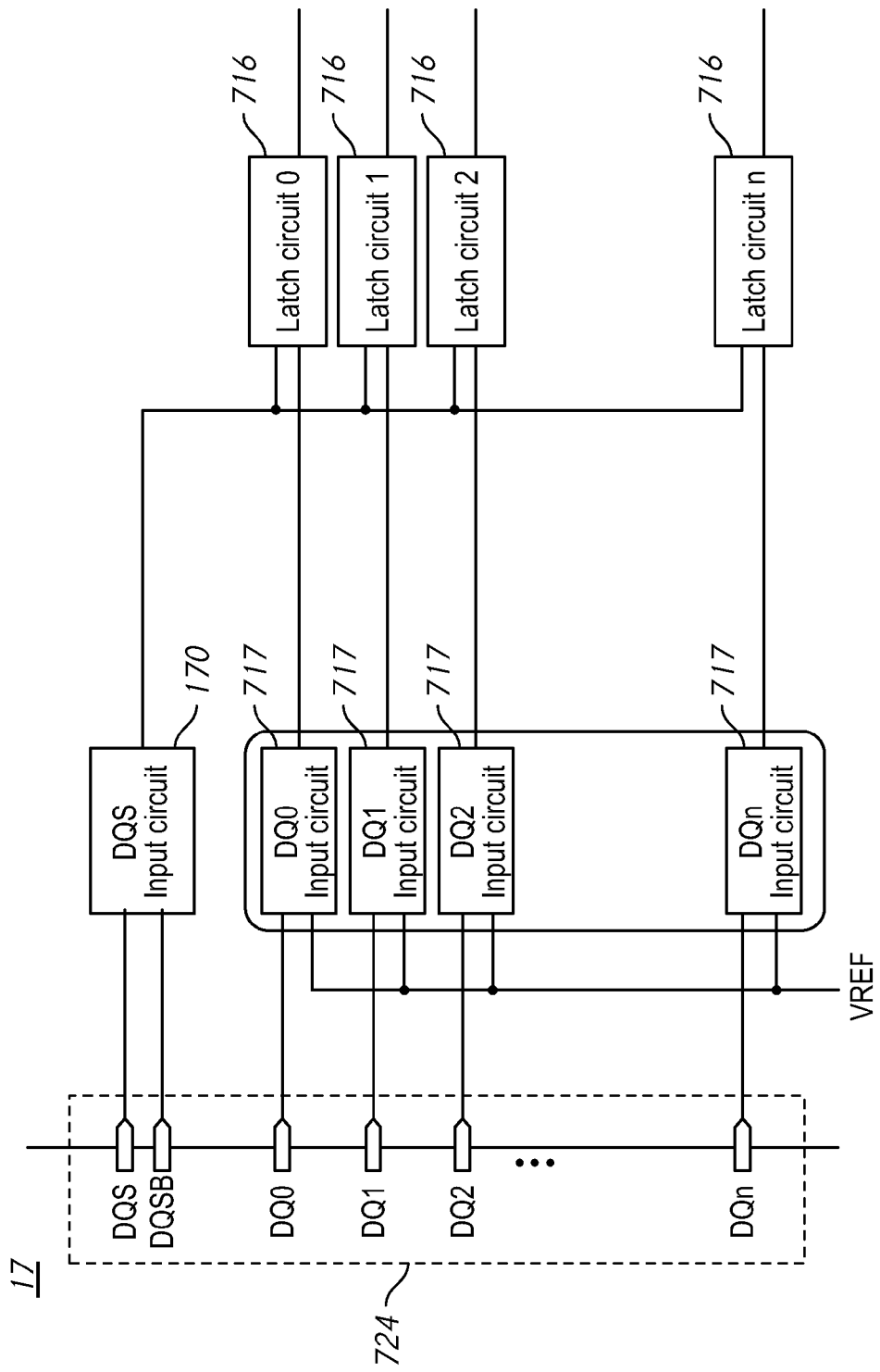
FIG. 7 is a schematic diagram of an input/output circuit including data input circuits according to an embodiment of the present disclosure.

FIG. 7 is a schematic diagram of an input/output circuit including data input circuits according to an embodiment of the present disclosure. The input/output circuit 17 includes data terminals 724 including a data strobe terminal DQS, a complementary data strobe terminal DQSB and a plurality of data terminals DQO-DQn where "n+1" is the number of the plurality of data terminals. A data strobe signal is used for capturing data at high data rates. The input/output circuit 17 also includes a data strobe (DQS) input circuit 170, a plurality of data input circuits 717 and a plurality of latch circuits 716 respective to the plurality of data terminals. The plurality of data input circuits 717 may be any data input circuit included in an input/output circuit 17 as described in FIGS. 2, 4, 5 and 6. The plurality of data input circuits 717 receive a reference voltage (VREF) and respective data the respective data terminals 724, and provide output signals. Each latch circuit 716 receives a data strobe signal from the DQS input circuit 170 and the respective output signal from the respective data input circuit for capturing the data.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
an input node;
a reference node supplied with a reference voltage;
first, second, third and fourth nodes;
a first transistor coupled between the first node and the second node, the first transistor having a gate coupled to the reference node;
a second transistor coupled between the first node and the third node, the second transistor having a gate coupled to the input node;
a third transistor coupled between the second node and the fourth node, the third transistor having a gate coupled to the third node;
a fourth transistor coupled between the third node and the fourth node, the fourth transistor having a gate coupled to the second node;
a first resistor having one end coupled to the second node and further having an other end;
a second resistor having one end coupled to the third node and further having an other end;
a fifth transistor coupled between the second node and the fourth node, the fifth transistor having a gate coupled to an other end of the first resistor; and
a sixth transistor coupled between the third node and the fourth node, the sixth transistor having a gate coupled to the other end of the second resistor.

2. The apparatus of claim 1, wherein a first impedance between the second node and the fourth node and a second impedance between the third node and the fourth node are substantially the same, and
wherein the first resistor and the second resistor have substantially the same resistance.

3. The apparatus of claim 1, further comprising:
a seventh transistor coupled between the first node and the second node, the seventh transistor being different in threshold voltage than the first transistor and having a gate coupled to the reference node; and
an eighth transistor coupled between the first node and the third node, the eighth transistor being different in threshold voltage than the second transistor and having a gate coupled to the input node.

4. The apparatus of claim 3, wherein each of the first transistor, the second transistor, the seventh transistor and the eighth transistor is of a first conductivity type and each of the third transistor, the fourth transistor, the fifth transistor and the sixth transistor is of a second conductivity type.

5. The apparatus of claim 3, further comprising a bias transistor coupled between the first node and a ground node and configured to receive a bias signal.

6. The apparatus of claim 3, further comprising:
a ninth transistor coupled between the second node and a fifth node, the ninth transistor having a gate coupled to the input node; and
a tenth transistor coupled between the third node and the fifth node, the tenth transistor having a gate coupled to the reference node.

7. The apparatus of claim 6, further comprising:
a first bias transistor coupled between the fifth node and a ground node;
a second bias transistor coupled between the first node and a ground node; and
a sixth node coupling a gate of the first bias transistor and a gate of the second bias transistor and being configured to commonly provide a bias signal to the first bias transistor and the second bias transistor.

8. The apparatus of claim 7, further comprising:
a third resistor comprising one end coupled to the second node; and,
a fourth resistor comprising one end coupled to the other end of the third resistor and the other end coupled to the third node,
wherein the other end of the third resistor and the one end of the fourth resistor are coupled to the sixth node.

9. The apparatus of claim 1, further comprising an amplifier coupled to the second node and the third node, the amplifier being configured to output a data signal of which a level is determined responsive to a potential difference between the second node and the third node.

10. The apparatus of claim 1, further comprising:
a latch circuit configured to receive a data strobe signal from a data strobe input circuit and an output data signal from the data input circuit, and further configured to capture data from the data signal.

11. An apparatus comprising:
a data input circuit, comprising:
a first transistor having one of a source and a drain coupled to a first output node and configured to receive a reference voltage;
a second transistor having one of a source and a drain coupled to a second output node and configured to receive an input signal;
a third transistor having one of a source and a drain coupled to a power supply and a gate coupled to the second output node; and
a fourth transistor having one of a source and a drain coupled to the power supply and a gate coupled to the first output node;
a fifth transistor having one of a source and a drain coupled to the power supply and the other of the source and the drain coupled to the first output node; and
a sixth transistor having one of a source and a drain coupled to the power supply and the other of the source and the drain coupled to the second output node; and a first resistor coupled between a gate and the other of the source and the drain of the fifth transistor; and a second resistor coupled between a gate and the other of the source and the drain of the sixth transistor, wherein one of the first resistor and the second resistor is configured to cause a delay in transmitting a potential transition of the other of the source and the drain of the fifth transistor or a potential transition of the other of the source and the drain of the sixth transistor to the gate of the fifth transistor or the gate of the sixth transistor, respectively, wherein one of the fifth transistor and the sixth transistor remains active in a manner to accelerate the potential transition of a drain of the fifth transistor or the potential transition responsive to the delay by the one of the first resistor and the second resistor, respectively.

12. The apparatus of claim 9, wherein a first impedance between the first output node and the power supply and a second impedance between the second output node and the fourth node are substantially the same, and wherein the first resistor and the second resistor have substantially the same resistance.

13. The apparatus of claim 11, further comprising:

a seventh transistor coupled between the first output node and the one of the source and the drain of the first transistor, the seventh transistor, and having a gate configured to receive the reference voltage; and an eighth transistor coupled between the second output node and the one of the source and the drain of the second transistor, and having a gate coupled to the input node, wherein the seventh transistor is different in threshold voltage than the first transistor and the eighth transistor is different in threshold voltage than the second transistor, and wherein at least one of the seventh transistor and the eighth transistor is configured to decrease a delay time difference between a falling propagation delay and a rising propagation delay.

14. The apparatus of claim 13, wherein each of the first transistor, the second transistor, the seventh transistor and the eighth transistor is of a first conductivity type and each of the third transistor, the fourth transistor, the fifth transistor and the sixth transistor is of a second conductivity type.

15. The apparatus of claim 13, further comprising a bias transistor coupled between the one of the source and the drain of the second transistor and a ground node and configured to receive a bias signal.

16. The apparatus of claim 13, further comprising:

a ninth transistor coupled to the first output node, the ninth transistor having a gate coupled to the input node; and a tenth transistor coupled to the second output node, the tenth transistor having a gate coupled to the reference node, wherein one of a source and a drain of the ninth transistor is coupled to one of a source and a drain of the tenth transistor.

17. The apparatus of claim 16, further comprising:

a first bias transistor coupled between the one of the source and the drain of the ninth transistor and a ground node and configured to receive a bias signal;

a second bias transistor coupled between the one of the source and the drain of the first transistor and a ground node and configured to receive the bias signal.

18. The apparatus of claim 17, further comprising:

a third resistor comprising one end coupled to the first output node; and, a fourth resistor comprising one end coupled to the second output node;

wherein an other end of the third resistor and an other end of the fourth resistor are coupled and configured to provide the bias signal.

19. The apparatus of claim 11, further comprising an amplifier coupled to the first output node and the second output node, the amplifier being configured to output a data signal of which a level is determined responsive to a potential difference between the second node and the third node.

20. The apparatus of claim 19, further comprising:

a latch circuit configured to receive the data signal from the data input circuit and a data strobe signal, and further configured to capture data from the data signal.

* * * * *